United States Patent
Dash et al.

(10) Patent No.: US 9,806,614 B2
(45) Date of Patent: Oct. 31, 2017

(54) LOW POWER ZERO INDUCTOR CURRENT DETECTION CIRCUIT

(71) Applicant: TEXAS INSTRUMENTS INCORPORATED, Dallas, TX (US)

(72) Inventors: Ranjit Kumar Dash, Bangalore (IN); Keith Edmund Kunz, Bryan, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 62 days.

(21) Appl. No.: 14/973,146

(22) Filed: Dec. 17, 2015

(65) Prior Publication Data

US 2017/0179823 A1 Jun. 22, 2017

(51) Int. Cl.
| | |
|---|---|
| G05F 1/44 | (2006.01) |
| H02M 3/158 | (2006.01) |
| G01R 19/00 | (2006.01) |
| G05F 3/16 | (2006.01) |
| H02M 3/156 | (2006.01) |
| H02M 1/00 | (2006.01) |

(52) U.S. Cl.
CPC ............ *H02M 3/158* (2013.01); *G01R 19/00* (2013.01); *H02M 3/156* (2013.01); *H02M 2001/0009* (2013.01)

(58) Field of Classification Search
CPC .................. H02M 3/158; H02M 3/156; H02M 2001/0009; G05F 1/44; G05F 3/16
USPC ...... 323/222, 235, 282–285, 315; 363/21.02, 363/131, 132
See application file for complete search history.

(56) References Cited

U.S. PATENT DOCUMENTS

| | | | | |
|---|---|---|---|---|
| 5,497,311 A | * | 3/1996 | Hanawaka | H02M 3/33507 363/21.03 |
| 6,172,882 B1 | * | 1/2001 | Tanaka | H02M 7/5387 363/132 |
| 6,849,828 B2 | * | 2/2005 | Aigner | H02M 7/5236 219/130.21 |
| 7,224,149 B2 | * | 5/2007 | Endo | H02M 3/158 323/222 |
| 7,521,911 B2 | * | 4/2009 | Endo | H02M 3/1588 323/222 |
| 8,581,561 B2 | * | 11/2013 | Yun | H02M 3/07 323/266 |

(Continued)

FOREIGN PATENT DOCUMENTS

JP 2007151324 A 6/2007

OTHER PUBLICATIONS

International Search Report for PCT/US2016/067476 dated May 18, 2017.

*Primary Examiner* — Adolf Berhane
*Assistant Examiner* — Nusrat Quddus
(74) *Attorney, Agent, or Firm* — John R. Pessetto; Charles A. Brill; Frank D. Crimino (57) ABSTRACT

Methods and apparatus for detecting a zero inductor current to control switch transitions for a power converter. An example method includes outputting a first voltage and a first current, receiving the first voltage and output a second voltage into an input of a comparator, when the second voltage is above a third voltage, outputting a first output voltage, when the second voltage is below the third voltage, outputting a second output voltage, determining when the first current is zero based the output of the comparator, enabling a set of switches based on when the first current is zero.

21 Claims, 7 Drawing Sheets

(56) References Cited

U.S. PATENT DOCUMENTS

| 8,823,339 B2 | 9/2014 | Lee et al. |
| 2007/0018618 A1* | 1/2007 | Endo ................... H02M 3/1588 323/224 |
| 2015/0084607 A1* | 3/2015 | Hayami ................ H02M 3/158 323/271 |
| 2015/0288280 A1 | 10/2015 | Lee et al. |

* cited by examiner

LOW POWER ZERO INDUCTOR CURRENT DETECTION CIRCUIT

FIELD OF THE DISCLOSURE

This disclosure relates generally to power converters and, more particularly, to methods and apparatus of detecting zero inductor current in a power converter.

BACKGROUND

A power converter (e.g., direct current to direct current (DC-DC) converter) converts an input voltage to a desired voltage. Many power converters require a number of switches to direct alternating current through the power converter to output the desired voltage. Transitioning the switches (e.g., from enable to disable or from disable to enable) when the alternating current is zero (or virtually zero) minimizes voltage loss associated with the switches. Voltage loss creates undesirable power consumption and a slower overall circuit. Additional circuitry may be used to determine when the alternating current is zero.

SUMMARY

Examples disclosed herein provide a zero inductor current detection to control switch transitions for a power converter. An example apparatus disclosed herein includes a resonance circuit to output a first voltage and a first current. In such examples, a high pass filter receives the first voltage and outputs a second voltage into an input of a comparator. In such examples, the comparator, when the second voltage is above a third voltage, outputs a first output voltage and when the second voltage is below the third voltage, outputs a second output voltage. In such examples, a switch controller determines when the first current is zero based on the output of the comparator and enables a set of switches based on when the first current is zero.

DETAILED DESCRIPTION

Power converters (e.g., buck converters) include a number of switches to control current through and/or voltage across inductors and capacitors to covert a supply voltage to a desired voltage. Switch transitioning (e.g., disabling one switch and enabling another switch) creates an oscillating (e.g., sinusoidal) inductor current (e.g., an alternating current (AC)) by charging and discharging the inductor(s) and the capacitor(s) associated with a power converter. The inductor current oscillates from a positive current to a negative current and vice versa. If a switch transition occurs when the inductor current is high (e.g., near a maximum or a minimum of the inductor current), there is a large voltage drop across the switch, leading to high energy loss. If a switch transition occurs when the inductor current is low (e.g., zero or nearly zero), there is a small voltage drop across the switch, leading to low energy loss. For example, if the inductor current is 70 milliamps (mA) and a resistance associated with the switch is 100 mΩ, then the voltage drop across the switch is 7 millivolts (mV) (e.g., (70 mA)(100 mΩ)=7 mV). However, if the inductor current is 2 mA, then the voltage drop across the switch is 0.2 mV (e.g., (2 mA)(100 mΩ)=0.2 mV) To minimize energy loss during switching transitions, converters may transition switches when the inductor current (e.g., resonant current) is zero or approximately zero. Additional hardware is required to determine when the inductor current is zero.

AC current and AC voltage generated by a converter are 90 degrees out of phase (e.g., a waveform associated with the voltage leads a waveform associated with the current by 90 degrees). Since the AC voltage leads the AC current by 90 degrees, the peak (e.g., maximum) and crest (e.g., minimum) of the AC voltage occurs when the AC current is zero. Put another way, the AC current is zero whenever the slope of the AC voltage is zero (e.g., $d(V_{AC})/dt=0$). Examples disclosed herein take advantage of the phase relationship between the AC current and the AC voltage to determine when the inductor current is zero.

Conventional techniques for determining when the inductor current is zero include a feedback loop requiring the inductor current to flow through a power switch and/or a sense resistor. Such conventional techniques detect a voltage across the power switch and/or the sense resistor (e.g., representing the inductor current) when the switch is on and detecting when the voltage across the switch and/or the sense resistor goes to zero. With time, the feedback loop will degrade. Thus, the conventional techniques lead to efficiency loss during switch transitions. Additionally, if the converter has multiple outputs, the size and complexity of circuits associated with the conventional techniques increase significantly. Additional conventional techniques intentionally induce a delay to determine zero inductor current. Such conventional techniques induce delay of an AC voltage and compare the delayed signal to the original signal. Such conventional techniques do not work for real time signals and the delay creates small inaccuracies in the zero current detection.

Examples disclosed herein include determining when the inductor current is zero by inputting a resonant voltage (e.g. AC voltage) associated with a power converter into a high pass filter. An output of the high pass shifts the resonant voltage by 90 degrees. Since the resonant voltage is shifted 90 degrees, the output of the high pass filter is representative of a resonant current (e.g., associated with the inductor current). A comparator is used to compare the output of the high pass filter to ground (e.g., 0 Volts (V)) to determine when the inductor current is zero (e.g., based on when the resonant voltage reaches a peak and/or crest). A switch controller receives the output of the comparator to determine when to transition switches associated with the converter. If the resonant current is close to (but not exactly) zero during a switch transition, the resonant voltage may include small non-sinusoidal sections. Additionally, when the inductor is charging, the resonant voltage may also be non-sinusoidal. A masking circuit may be implemented to mask (e.g., ignore) the comparator output during such non-sinusoidal sections.

An example apparatus includes a resonance circuit to output a first voltage and a first current; a high pass filter to receive the first voltage and output a second voltage into an input of a comparator; the comparator to: when the second voltage is above a third voltage, output a first output voltage; and when the second voltage is below the third voltage, output a second output voltage; and a switch controller to: determine when the first current is zero based the output of the comparator; and enable a set of switches based on when the first current is zero.

Figure 1:
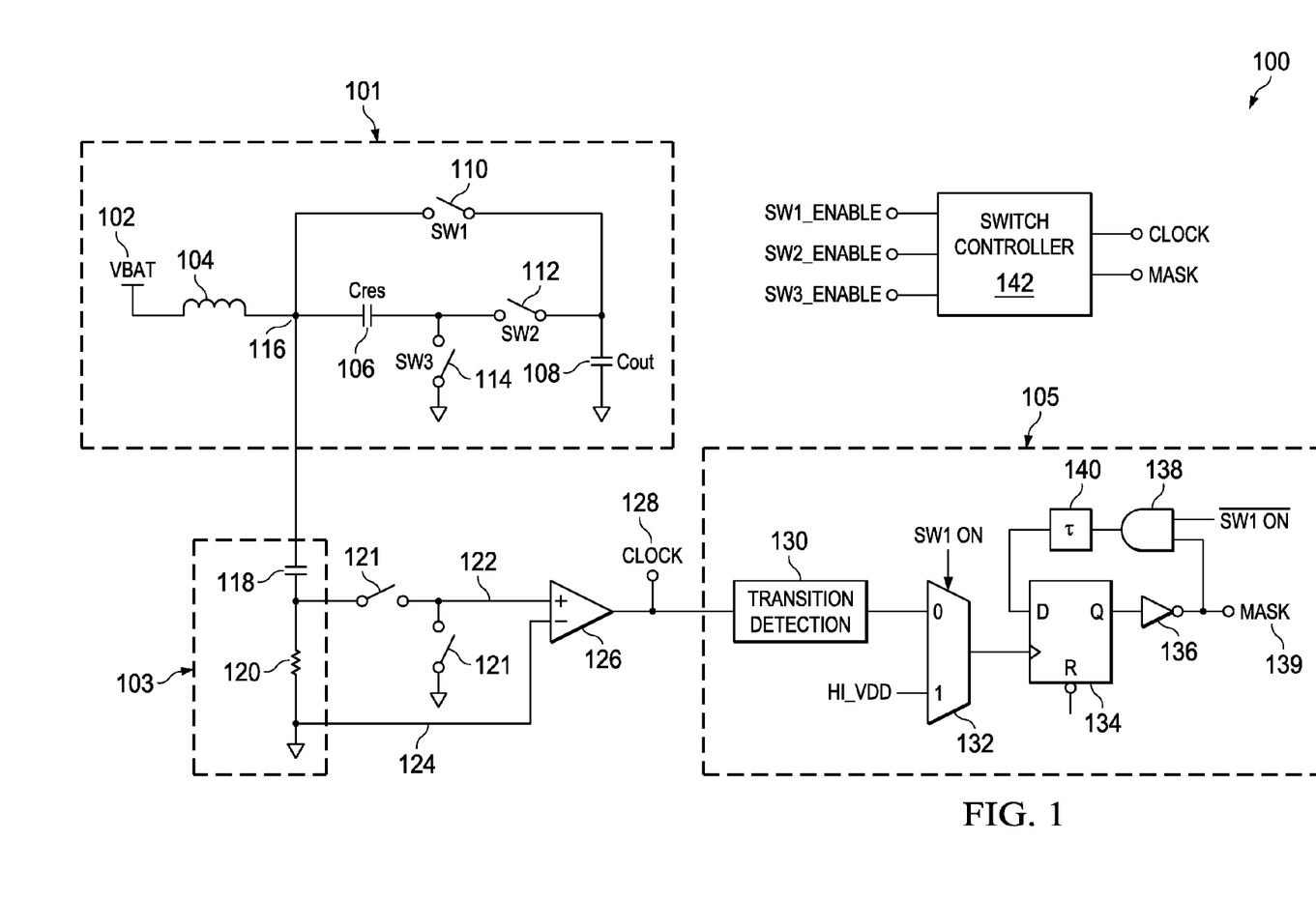
FIG. 1 is an example converter circuit structured to control a set of switches based on zero resonant current detection.

FIG. 1 is an example converter IC 100 with zero current detection. The example converter IC 100 includes an example resonance circuit 101, an example power source Vbat 102, an example high pass filter (HPF) circuit 103, an example inductor 104, an example masking circuit 105, example capacitors 106, 108, 118, example switches 110, 112, 114, 121 an example resonant voltage 116, an example resistor 120, an example positive input 122, an example negative input 124, an example comparator 126, an example clock voltage 128, an example transition detection 130, an example multiplexer (MUX) 132, an example data (D) flip-flop 134, an example inverter 136, an example AND gate 138, an example masking voltage 139, an example delay circuit 140, and an example switch controller 142.

The example converter 100 is a buck converter. Alternatively, the example converter 100 may be a voltage regulator, a linear regulator, a magnetic converter, an alternating current to direct current (AC-DC) converter (e.g., a rectifier, a mains supply voltage unit, a switched-mode power supply, etc.), an AC-AC converter (e.g., a transformer, an autotransformer, a voltage converter, a voltage regulator, a cycloconverter, a variable-frequency transformer, etc.), a DC to AC converter (e.g. an inverter), a multiphase converter, and/or any other device that can convert a first voltage to a second voltage. The example converter 100 regulates an output voltage based on a voltage stored in the example output capacitor 108.

The example converter 100 includes an example resonance circuit 101. The example resonance circuit 100 includes the example power supply 102, the example inductor 104, the example resonant capacitor 106, the example output capacitance 108, the example switches 110, 112, 114, and the example resonant voltage 116. The example power supply 102 is a battery (e.g., a lithium ion battery). Alternatively, the power supply may be an AC power supply, a DC power supply, and/or any other device capable of outputting a voltage and/or a current. The example resonant capacitor 106 may be a ceramic capacitor, a film capacitor, an electrolytic capacitor, a super capacitor, and/or any other type of capacitor. The example switches 110, 112, 114 may be opened (e.g., disabled) and/or closed (e.g., enabled) to prevent and/or allow current to flow. The example switches 110, 112, 114 may be electrical switches (e.g., low voltage transistors) and/or mechanical switches. The example output capacitance 108 is representative of an output capacitance associated with a load.

When the example switch SW1 110 is enabled (e.g., closed), a current is drawn from the example power supply 102. The current flows through and charges the example inductor 104. In some examples, the longer that the switch SW1 is enabled (e.g., the longer the inductor 104 is charged), the higher the resonant voltage 116 will rise. When the example switch SW2 112 is enabled the current is drawn from the example charged inductor 104. The current flows through and charges the example resonant capacitor 106. Charging the resonant capacitor 106 increases the example resonant voltage 116. When example resonant voltage 116 reaches its peak, the current will be around zero (e.g., since voltage and current are 90 degrees out of phase).

When the example switch SW3 114 is enabled, the charged example resonant capacitor 106 is discharged and the current flows toward the example inductor 104.

The example converter 100 includes an example HPF circuit 103. The example HPF circuit 103 includes the example HPF capacitor 118, the example HPF resistor 120, the example positive input 122, and the example negative input 124. The example HPF Capacitor 118 allows AC current to flow through the example HPF circuit 103 and prevents DC current from flowing through the HPF circuit 103. Additionally, the example HPF capacitor 118 shifts the resonant voltage 116 by 90 degrees. Shifting the resonant voltage 116 by 90 degrees allows the output of the HPF capacitor 118 (e.g., the example positive voltage input 122) to be in phase with the current. The HPF capacitor 118 may be a ceramic capacitor, a film capacitor, an electrolytic capacitor, a super capacitor, and/or any other type of capacitor. The example HPF resistor 120 may be a carbon resistor, a film resistor, a wirewound resistor, and/or any other type of resistor. When current flows from the example HPF circuit 103 to the example resonance circuit 101 (e.g., when the resonant current is negative), the example HPF resistor 120 creates a voltage drop from the example negative input 124 to the example positive input 122. When current flows from the example resonance circuit 101 to the example HPF circuit 103 (e.g., when the current is positive), the example HPF resistor 120 creates a voltage drop from the positive input 122 to the example negative input 124. In some examples, the example switches 121 are used to help mask input and output voltages (e.g., the example resonant voltage 116 and/or the example clock 128) to avoid glitches that may occur during transitions, as further described herein.

The example comparator 126 outputs a voltage based on a comparison of two inputs. The example comparator 126 may be an op amp comparator, a Schmitt trigger, a positive feedback comparator, a dedicated comparator IC, and/or any other type of comparator. In the illustrated example converter IC 100, the inputs for the example comparator 126 are the example positive input 122 (e.g., the voltage across the HPF resistor 120) and the example negative input 124 (e.g., ground). Alternatively, the output of the HPF may be inputted into the negative input 124 and ground may be inputted into the positive input 122. The output of the example comparator 126 is the example clock voltage 128. The example clock voltage 128 may be a low voltage (e.g., 0V) or a high voltage (e.g., 1.2 V) to indicate which input (e.g., the positive input 122 or the negative input 124) is larger. For example, when the positive input 122 is higher than the negative input 124, the example comparator 126 outputs a high clock voltage 128 and when the positive input 122 is lower than the negative input 124, the example comparator 126 outputs a low voltage clock voltage 128. The structure of the example comparator 126 is further described in FIG. 3.

The example converter 100 includes an example masking circuit 105. The example masking circuit 105 includes the example transition detection 130, the example MUX 132, the example D flip-flop 134, the example inverter 136, the example AND gate 138, the example masking voltage 139, and the example RC delay circuit 140. Glitches (e.g., inaccurate clock transitions) may frequently occur during non-sinusoidal phases (e.g., while the example SW1 110 is enable and/or during switch transition) due to sharp voltage transitions. To prevent such glitches, the example masking circuit is structured to mask any comparison of the comparator 126 during the non-sinusoidal phases. The example transition detection 130 detects a switch transition based on a transition of the example clock voltage 128 from a high voltage to a low voltage and/or from a low voltage to a high voltage (e.g., indicating that the resonant current is zero). The example transition detection 130 outputs a pulse (e.g., high voltage for a duration of time) when a transition is detected on the example clock voltage 128. The duration of time may be based on user and/or manufacturer settings. The example transition detection 130 may implemented by hardware (e.g., such as a flip-flop), software, or firmware.

The example MUX 132 has three inputs and one output. Alternatively, the MUX 132 may have any number of inputs and/or outputs. In the illustrated example masking circuit 105, the inputs are the pulses from the transition detection 130, a high power supply, an enable signal associated with the example switch SW1 110. When the enable signal associated with the example switch SW1 110 is low (e.g., 0 V) the output of the MUX 132 is the output of the transition detection 130 and when the example the enable signal associated with the example switch SW1 110 is high (e.g., 2 V) the output of the MUX 132 is a high voltage.

The example D flip-flop 134 is a clocked D flip-flop. Alternatively, the example D flip-flop 134 may be any other type of flip flop. When the output of the example MUX 132 is high, the Q output of the example D flip-flop 134 mirrors the D input. When the output of the example MUX 132 is low, the Q output retains its voltage (e.g., if high then Q output stays high, if low then Q output stays low) until the output of the example MUX 132 goes high. The Q output is fed back into the R input through the example inverter 136, the example AND gate 138, and the example RC delay circuit 140. The example RC delay circuit 144 toggles the feedback to prevent chattering during a transition between switch enables. Additionally, the example inverter 136 outputs the example masking voltage 139. Thus, the example masking voltage 139 is high unless the example switch SW1 110 is enabled and/or at least one of the example switches 110, 112, 114 are transitioning from enabled to disabled.

The example switch controller 142 is a device that controls (e.g. enables and/or disables) the example switches 110, 112, 114 based on the example clock voltage 128. The example switch controller 142 has two inputs (e.g., the example clock voltage 128 and the example masking voltage 139) and three outputs (e.g., three enable lines associated with the example switch SW1 110, the example switch SW2 112, and the example switch SW3 114). When the example switch controller 142 sends an enable signal (e.g. a high voltage) on an enable line, the example switch 110, 112, 114 associated with the enable line is closed (e.g., enabled). When the example switch controller 142 sends a disable signal (e.g., 0V) on the enable line, the example switch 110, 112, 114 associated with the enable line is open (e.g., disabled). The example switch controller 142 is further described in FIG. 4.

In operation, the example resonance circuit 101 produces a resonant current and a resonant voltage that vary in time (e.g., an AC voltage and an AC current). The resonant voltage and resonant current are 90 out of phase (e.g., when the resonant voltage is at a maximum or minimum the resonant voltage is approximately zero). The example switch controller 142 enables and/or disables switches (e.g., SW1 110, SW2 112, and/or SW3 114) when the current is approximately zero. Since the resonant current is approximately zero whenever the resonant voltage is at a maximum or minimum, the example switch controller 142 determines when the resonant voltage is at a peak (e.g., a maximum voltage) or crest (e.g., a minimum voltage) in order to enable and/or disable the example switches 110, 112, 114.

To initiate the example converter IC 100, the example switch controller 142 enables the example switch SW1 for a duration of time to charge the example inductor 104. The duration of time depends the desired peak resonant voltage 116 (e.g., the longer the duration the larger the peak resonant voltage 116). Once the duration ends, the example switch controller 142 disables the example switch SW1 110 and enables the example switch SW2 112. Once the example switch SW2 112 is enabled, a current is drawn from the example charged inductor 104 is a positive current (e.g., the current flows through the example inductor 104 towards the resonant capacitor 118 increasing the example resonant voltage 116). Additionally, the current flows through the HPF capacitor 118 shifting the phase angle of the resonant voltage by 90 degrees. Additionally, the current flowing through the HPF resistor 120 creates a voltage drop from the example positive input 122 and the negative output 124. The voltage drop causes the example positive input 122 to have a larger voltage than the example negative input 124. Since the voltage of positive input 122 is higher than the voltage of the negative input 124 (e.g., ground), the example comparator 126 outputs an example clock voltage 128. When the current becomes a negative current (e.g., the current reverses direction of current flow), the current begins to flow toward the example inductor 104. As the current flows away from the HPF 103, there is a voltage drop from the example negative input 124 to the positive input 122 across the example HPF 120. Since the voltage of the negative input 124 is higher than the positive input 122, the example comparator 126 outputs a low voltage on the example clock voltage 128 indicating that the example resonant voltage 116 has reached its peak (e.g., the current is approximately zero and has switched from positive to negative). In some examples, the example switches 121 may be enabled or disabled to prevent glitches associated with the example clock voltage 128 during non-sinusoidal voltage transitions.

When the example clock voltage 128 goes to a low voltage (e.g., the resonant current is approximately zero), the example switch controller 142 disables the example switch SW2 112 and enables the example switch SW3 114. Enabling the example switch SW3 114 discharges the resonant capacitor 106 causing the current to flow through the example inductor 104 toward the example power supply 102. The example resonant voltage 116 decreases as the example resonant capacitor 106 discharges. Additionally, the masking circuit 105 outputs a low masking voltage 139 pulse in response to the switch transition (e.g., to prevent glitches). While the current travels from the example HPF filter 103 toward the example inductor 104, there continues to be a voltage drop from the example negative input 124 to the example positive input 122 across the example capacitor 118. Since the voltage of the negative input 124 is higher than the voltage of the positive input 122, the example comparator 126 continues to output a low voltage on the example clock voltage 128. When the current returns to zero (e.g. becoming positive again), the current will flow from the resonant circuit 101 to the example HPF circuit 103 creating a voltage drop across the HPF resistor 120 from the example positive voltage input 122 to the example negative voltage input 124. In response to the voltage drop, the example comparator 126 will output a high voltage on the clock voltage 128.

When the example clock voltage 128 returns to a high voltage (e.g., the resonant current is approximately zero), the example switch controller 142 disables the example switch SW3 114 and enables the example switch SW1 110. As previously described, enabling the example switch SW1 110 charges the example inductor 104. While the example switch SW1 110 is enabled and/or during a switch transition, the example masking circuit 105 masks (e.g., ignores) the example clock voltage 128 to adjust for any non-sinusoidal (e.g., linear) while the example inductor 104 charge. The entire process is repeated to maintain a desired output voltage associated with a voltage across the example output capacitance 108. Although the illustrated example converter IC 100 is described as a single phase power converter. The illustrated example converter IC 100 may include multiple phases and/or multiple outputs. In such examples, additional switches may be implemented to control the additional phases and/or outputs. In such examples, the peaks and/or crests for the multiple phases and/or multiple outputs would be determined in a similar manner.

Figure 2:
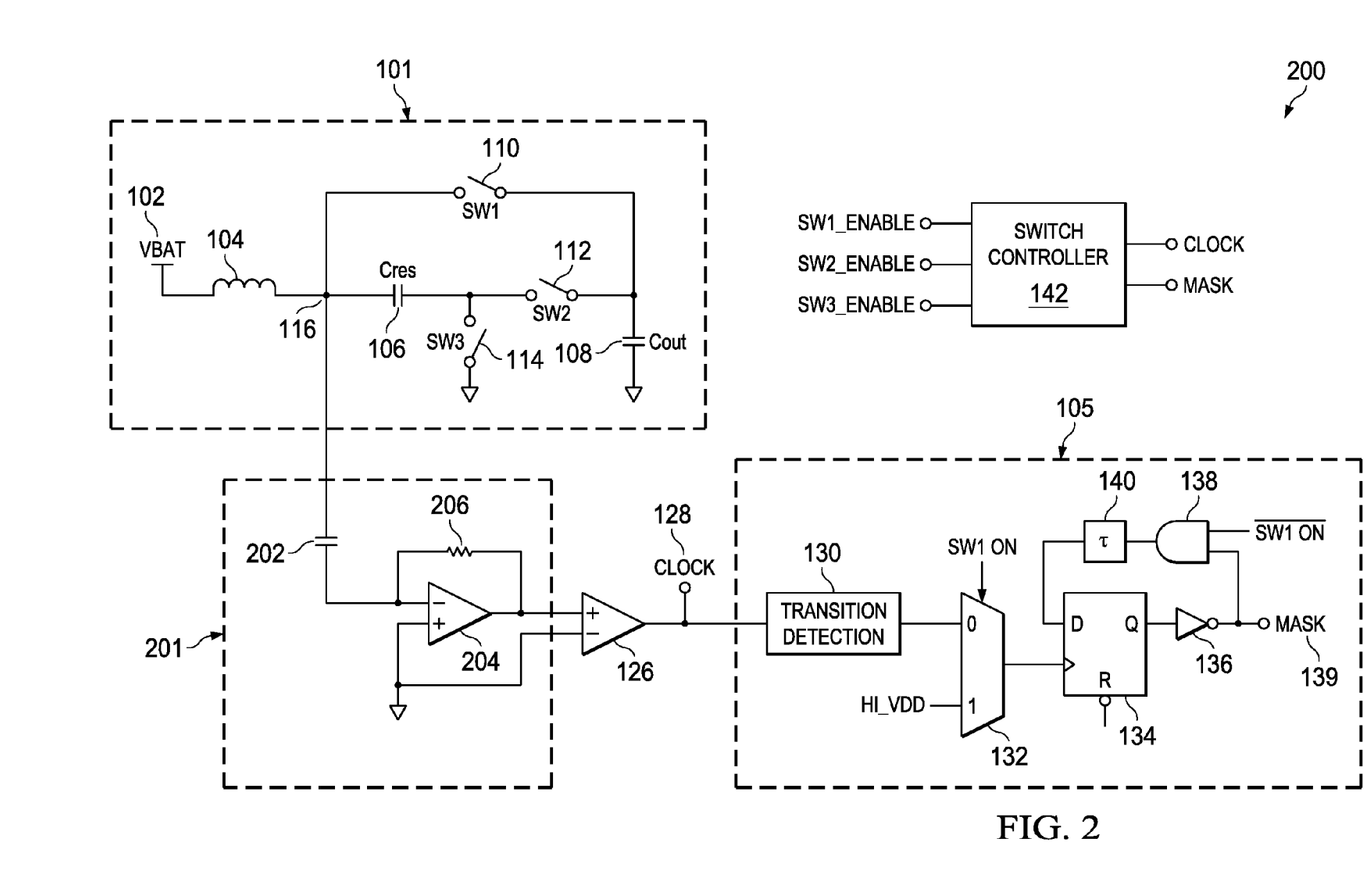
FIG. 2 is an alternative example converter circuit structured to control a set of switches based on zero resonant current detection.

FIG. 2 is an alternative example converter IC 200 with zero current detection. The example converter IC 200 includes the example resonance circuit 101, the example masking circuit 105, the example comparator 126, the example clock voltage 128, and the example switch controller 142 of FIG. 1. The example converter IC 200 further includes an alternative HPF circuit 201, an example HPF capacitor 202, an example amplifier 204, and an example feedback resistor 206.

The example alternative converter IC 200 includes an example HPF circuit 201. The example HPF circuit 201includes the example HPF capacitor 202, the example the example amplifier 204, and the example feedback resistor 206. The example HPF Capacitor 202 allows AC current to flow through the circuit and prevents DC current from flowing through the circuit. Additionally, the example HPF capacitor 202 shifts the phase of the resonant voltage 116 by 90 degrees (e.g., in phase with the resonant current). The HPF capacitor 202 may be a ceramic capacitor, a film capacitor, an electrolytic capacitor, a super capacitor, and/or any other type of capacitor. The example amplifier 204 is an inverting operational amplifier (e.g., an output of the example amplifier 204 is an amplified by the input multiplied by −1). The example amplifier 204 may be any type of amplifier. The example feedback resistor 206 may be a carbon resistor, a film resistor, a wirewound resistor, and/or any other type of resistor.

In operation, when the resonant current flows from the example resonance circuit 101 to the example alternative HPF circuit 201 (e.g., the resonant current is positive), the example feedback resistor 206 creates a positive voltage drop from the input of the example amplifier 204 to the output of the example amplifier 204. When current flows from the example alternative HPF circuit 201 to the example resonance circuit 101 (the resonant current is negative), the example HPF resistor 120 creates a negative voltage drop from the input of the example amplifier 204 to the output of the example amplifier 204. When the voltage drop is positive, the example amplifier 204 outputs an amplified negative output voltage. When the voltage drop is negative, the example amplifier 204 outputs an amplified positive output voltage. The example comparator 126 compares the amplified output voltage to ground. The example comparator 126 outputs a high voltage when the example amplifier 204 outputs the amplified positive output voltage (e.g., when the resonant current is negative). The example comparator 126 outputs a low voltage when the example amplifier 204 outputs the amplified negative output voltage (e.g., when the resonant current is positive). The example switch controller 142 enables and/or disables the example switches in the example resonant circuit 101 accordingly.

Figure 3:
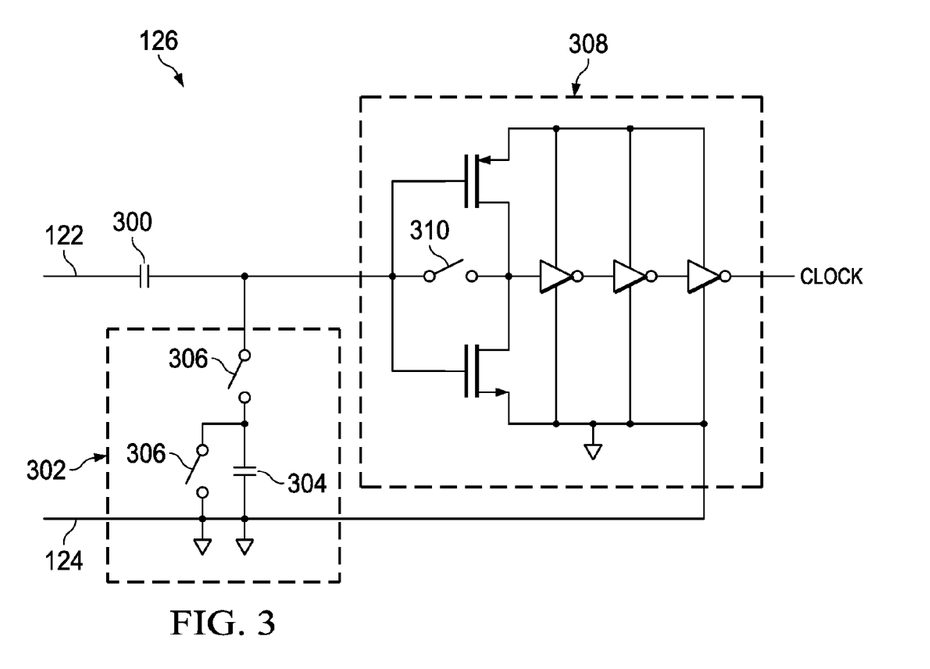
FIG. 3 is an example comparator circuit of the example converter circuit of FIGS. 1 and 2.

FIG. 3 is an example circuit representing the example comparator 126 of FIGS. 1 and 2. The example comparator 126 includes the example positive input voltage 122, the example negative input voltage 124, an example coupling capacitor 300, an example delay compensator 302, an example delay capacitor 304, example switches 306, 310, and an example auto-zero comparator 308.

The example coupling capacitor 300 stores the example positive input voltage 122. The example coupling capacitor 300 provides the positive input voltage 122 to the example delay compensator 302 and the example auto-zero comparator 308. The example coupling capacitor 300 may be a ceramic capacitor, a film capacitor, an electrolytic capacitor, a super capacitor, and/or any other type of capacitor.

The example delay compensator 302 compensates total delay associated with the example auto-zero comparator 308 by calibrating an input voltage inputted to the example auto-zero comparator 308. The example delay compensator 302 includes the example delay capacitor 304 and the example switches 306. In some examples, the example delay capacitor 304 is initialized with a zero voltage used as an initial voltage for the example delay capacitor 304. Since the final voltage at the input of the example auto-zero comparator 308 is determine by a ratio of the example coupling capacitor 300 and the example delay capacitor 304, a trigger point for enabling and/or disabling the example switches 306 is very well controlled. When the resonant current is positive (e.g., when the resonant current travels from the example resonance circuit 101 to the example HPF circuit 103 of FIG. 1), the switches 306 will be enabled/disabled earlier to compensate for delay associated with the example auto-zero comparator 308.

The example auto-zero comparator 308 compares the example positive voltage input 122 to the negative voltage input 124 (e.g., ground). Additionally, the example auto-zero comparator 308 is structured to cancel any small offset voltage that may exist. If the example positive voltage input 122 is larger than the example negative voltage input 124 (e.g., ground or 0V), then the example auto-zero comparator 308 outputs the high clock voltage 128. If the example positive voltage input 122 is less than the example negative voltage input 124, then the example auto-zero comparator 308 outputs the low clock voltage 128. In some examples, such as during an active voltage comparison, the example switch 310 is disabled to prevent auto-zero comparison. In some examples, the example switch 310 is enabled to enable auto-zero comparison. Enabling the example switch 310 enables the example comparator 126 to compare the positive voltage input 122 and the negative voltage input 124.

Figure 4:
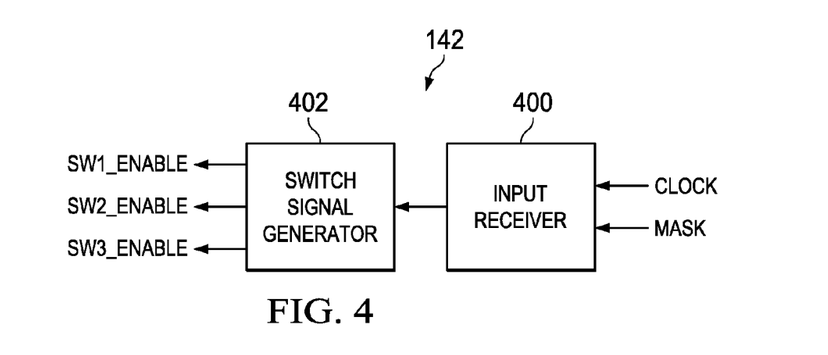
FIG. 4 is an example block diagram of an example switch controller of FIGS. 1 and 2.

FIG. 4 is an example block diagram of an example implementation of the example switch controller 142 of FIGS. 1 and 2, disclosed herein, to operate the example switches 110, 112, 114. While the example switch controller 142 of FIG. 4 is described in conjunction with the illustrated example converter IC 100, the example switch controller 142 may be utilized to control the example switch controller 142 of FIG. 2 and/or any IC associated with a converter. The example switch controller 142 is implemented to control the example converter IC 100 and/or any device where converters are used.

The example switch controller 142 includes an example input receiver 400 and an example switch signal generator 402. The input receiver 400 receives the example clock voltage 128. The example clock voltage 128 may be high or low depending on the output of the example comparator 126. The example switch controller 142 ignores the example clock voltage 128 when the example masking voltage 139 is low. As previously described, the masking voltage 139 is low during durations of time when the inductor 104 is charging and during switch transitions when the resonant voltage 116 is non-sinusoidal. Alternatively, the example masking voltage 139 may be high during non-sinusoidal durations (e.g., to prevent glitches).

The example switch signal generator 402 determines which example switch (e.g. SW1 110, SW2 112, SW3 114) to enable based on the example clock voltage 128. In some examples, the example switch signal generator 402 sends a high voltage to the example switches 110, 112, 114 to enable (e.g., close) the example switches 110, 112, 114 and sends a low voltage to the example switches 110, 112, 114 to disable (e.g., open) the example switches 110, 112, 114. Alternatively, the example switch signal generator 402 may send a low voltage to the example switches 110, 112, 114 to enable the example switches 110, 112, 114 and may send a high voltage to the example switches 110, 112, 114 to disable the example switches 110, 112, 114.

Initially, the example switch signal generator 402 enables the example switch SW1 110 for a set duration of time to charge the example inductor 104. The duration of time determines how high the example resonant voltage 116 will raise before a peak is reached. The duration of time may depend on a desired output voltage and/or user and/or manufacturer settings. Once the duration of time has elapsed, the example switch signal generator 402 disables the example switch SW1 110 and enables the example switch SW2 112 causing the resonant voltage 116 to increase toward the peak voltage. Once the peak is reached, the example clock voltage 128 will drop to a low voltage. When the example input receiver 400 determines that the clock voltage 128 has dropped to a low voltage, the example switch signal generator 402 disables the example switch SW2 112 and enables the example switch SW3 114, causing resonant voltage 116 to decrease. Once the peak is reached, the example clock voltage 128 will increase to a high voltage. When the example input receiver 400 determines that the clock voltage 128 has increased, the example switch signal generator 402 disables switch SW3 114 and enables switch SW1 110 causing the process to repeat. In some examples (e.g., such as the example IC 200 of FIG. 2), the output of the example converter 126 may be inverted (e.g., the output may be high when the current is negative and may be low when the current is positive). In such examples, the example switch signal generator 402 may adapt the switch enables and/or disables (e.g., enable switch SW3 114 when the output of the example comparator 126 is high). Alternatively, additional hardware (e.g., an inverter) may be used to invert the output of the example comparator 126 before it is received by the example input receiver 400.

While example manners of implementing the example switch controller 142 of FIGS. 1 and 2 are illustrated in FIG. 4, elements, processes and/or devices illustrated in FIG. 4 may be combined, divided, re-arranged, omitted, eliminated and/or implemented in any other way. Further, the example input receiver 400, the example switch signal generator 402, and/or, more generally, the example switch controller 142 of FIG. 4, may be implemented by hardware, machine readable instructions, software, firmware and/or any combination of hardware, machine readable instructions, software and/or firmware. Thus, for example, any of the example input receiver 400, the example switch signal generator 402, and/or, more generally, the example switch controller 142 of FIG. 4, could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example input receiver 400, the example switch signal generator 402, and/or, more generally, the example switch controller 142 of FIG. 4, is/are hereby expressly defined to include a tangible computer readable storage device or storage disk such as a memory, a digital versatile disk (DVD), a compact disk (CD), a Blu-ray disk, etc. storing the software and/or firmware. Further still, the example switch controller 142 of FIG. 4 includes elements, processes and/or devices in addition to, or instead of, those illustrated in FIG. 5, and/or may include more than one of any or all of the illustrated elements, processes and devices.

Figure 5:
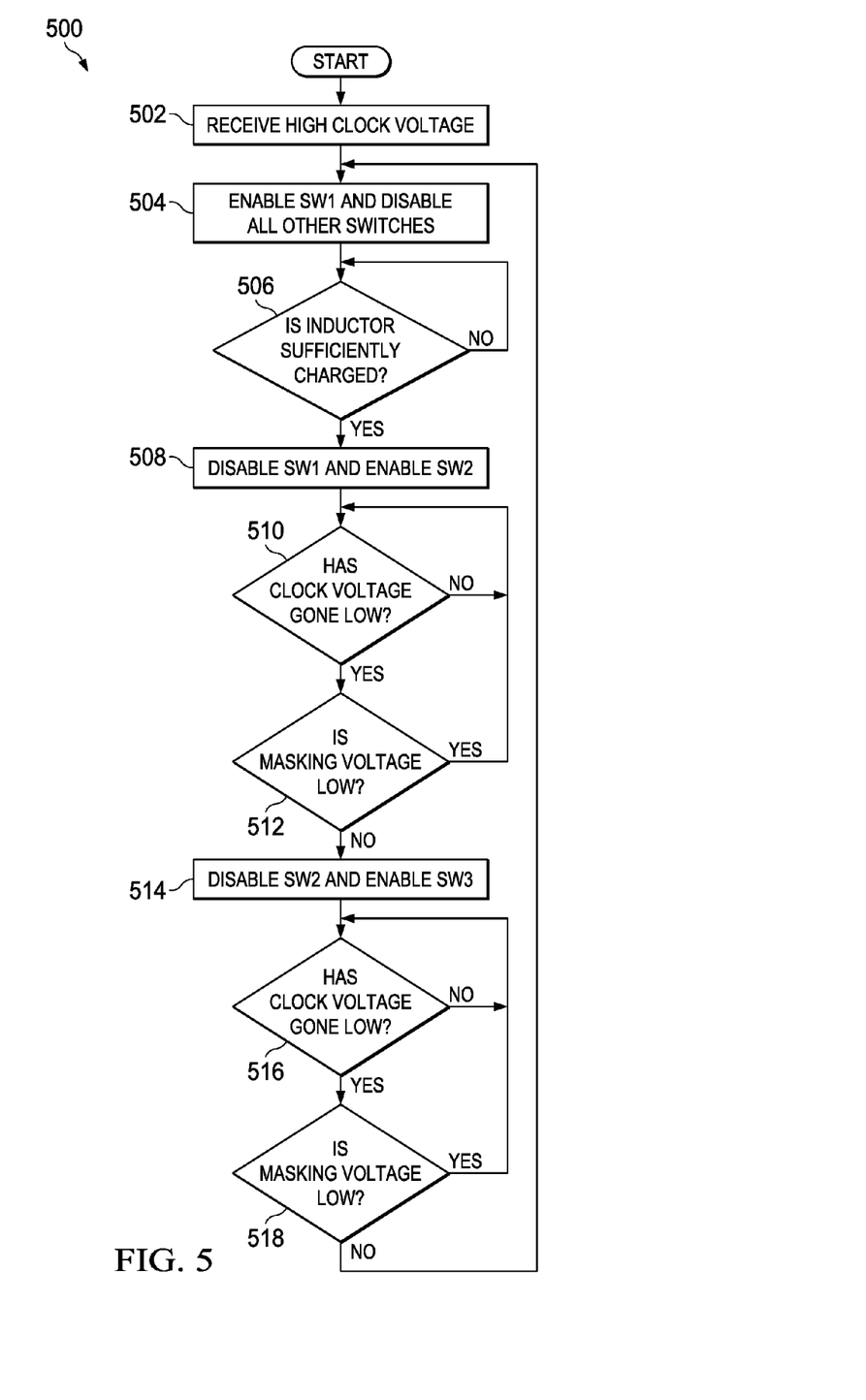
FIG. 5 is a flowchart representative of example machine readable instructions that may be executed to implement the example switch controller of FIG. 4 to enable the set of switches of FIGS. 1 and 2 based on the zero resonant current detection.

Flowcharts representative of example machine readable instructions for implementing the example switch controller 142 of FIG. 4 is shown in FIG. 5. In the examples, the machine readable instructions comprise a program for execution by a processor such as the processor 812 shown in the example processor platform 800 discussed below in connection with FIG. 8. The program may be embodied in machine readable instructions stored on a tangible computer readable storage medium such as a CD-ROM, a floppy disk, a hard drive, a digital versatile disk (DVD), a Blu-ray disk, or a memory associated with the processor 812, but the entire program and/or parts thereof could alternatively be executed by a device other than the processor 812 and/or embodied in firmware or dedicated hardware. Further, although the example program is described with reference to the flowcharts illustrated in FIG. 5, many other methods of implementing the example switch controller 142 of FIG. 4 may alternatively be used. For example, the order of execution of the blocks may be changed, and/or some of the blocks described may be changed, eliminated, or combined.

As mentioned above, the example process of FIG. 5 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIG. 5 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 5 is an example flowchart 500 representative of example machine readable instructions that may be executed to cause the example switch controller 226 of FIG. 4 to enable and/or disable the example switches 110, 112, 114 to control the example power converter IC 100 based on peak voltage (e.g., zero current) detection. Although the flowchart 500 is described in conjunction with the example converter IC 100 of FIG. 1, the flowchart 500 may be implements in the example converter IC 200 of FIG. 2, and/or any other circuit including a power converter.

At block 502, the example input receiver 400 receives a high clock voltage 128. At block 504, the example switch signal generator 402 enables the example switch SW1 110. As previously described, enabling the example switch SW1 110 charges the example inductor 104. At block 506, the example switch signal generator 402 determines if the example inductor 104 is sufficiently charged. The example switch signal generator 402 may determine that the inductor is sufficiently charged based on a duration of time, a desired output voltage, and/or user and/or manufacturer settings. If the example inductor 104 is not sufficiently charged, the switch signal generator 402 continues to keep the example switch SW1 110 enabled until the example inductor 104 is sufficiently charged. If the example inductor 104 is sufficiently charged, the switch signal generator 402 disabled the example SW1 110 and enables the example switch SW2 112 (block 508). As previously described, enabling the example switch SW2 112 increases the example resonant voltage 116. In some examples, the example comparator XX enters an active detection mode while the example switch SW2 112 is enabled to determine when the slope of the example resonant voltage XX is zero.

At block 510, the input receiver 400 determines if the example clock voltage 128 has decreased to a low voltage (e.g., 0V). If the clock voltage 128 is still high, the example switch signal generator 402 continues to enable the example switch SW2 112 until the clock voltage 128 drops to a low voltage. If the clock voltage 128 is low, the input receiver 400 determines if the example masking signal 139 is low (block 512). As previously described, a low masking voltage 139 is representative of the resonant voltage 116 being non-sinusoidal (e.g., linear). Therefore, if the masking voltage 139 is a low voltage, then the input receiver ignores the example clock voltage 128 and the example signal generator 402 continues to enable the example switch SW2 112 until the clock voltage 128 is a low voltage and the masking voltage 139 is a high voltage. If the masking voltage 139 is not a low voltage (e.g., is a high voltage), the example switch signal generator 402 disables the example switch SW2 112 and enables the example switch SW3 114 (block 514). As previously described, enabling the example switch SW3 114 decreases the example resonant voltage 116. In some examples, the example comparator XX enters an active detection mode while the example switch SW3 114 is enabled to determine when the slope of the example resonant voltage XX is zero.

At block 516, the input receiver 400 determines if the example clock voltage 128 has increase to a high voltage (e.g., 2V). If the clock voltage 128 is still low, the example switch signal generator 402 continues to enable the example switch SW3 112 until the clock voltage 128 increases to a high voltage. If the clock voltage 128 is high, the input receiver 400 determines if the masking voltage 139 is low (block 518). As previously described, a low masking voltage 139 is representative of the resonant voltage 116 being non-sinusoidal (e.g., linear). Therefore, if the example masking voltage 139 is a low voltage, then the input receiver 400 ignores the example clock voltage 128 and the example signal generator 402 continues to enable the example switch SW3 114 until the clock voltage 128 is a high voltage and the masking voltage 139 is a high voltage. If the masking voltage 139 is not a low voltage (e.g., is a high voltage), the process is repeated.

Figure 6:
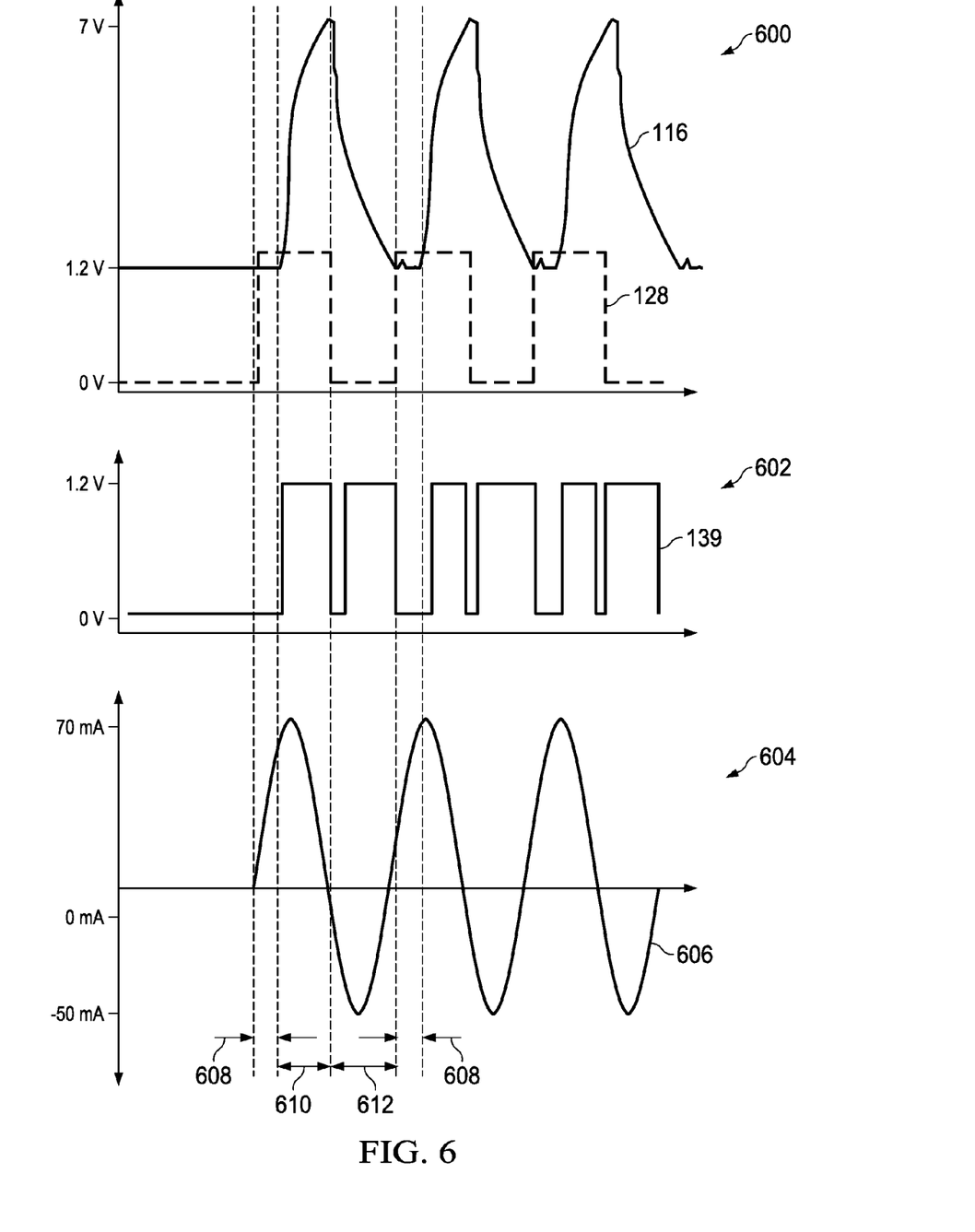
FIG. 6 is an example timing diagram for an example resonant voltage, an example clock voltage, an example masking voltage, and the example resonant current of FIGS. 1 and 2.

FIG. 6 illustrates three example timing diagrams 600, 602, 604 illustrating the example voltages and currents of the example power converter IC 100 of FIG. 1. The first example timing diagram 600 illustrates the example resonant voltage 116 and the example clock voltage 128 with respect to time. The second example timing diagram 602 illustrates the example masking voltage 139 with respect to time. The third example timing diagram 606 illustrates an example resonant current 606 associated with the current through the example inductor 104 with respect to time. The example timing diagrams 600, 602, 604 further include durations 608, 610, 612, and 614.

During the example first duration 608, the example clock voltage 128 increases to a high voltage. As previously described, when the example clock voltage 128 initially increases to a high voltage, the example switch SW1 110 is enabled to charge the example inductor 104. Additionally, during the example first duration 608, the example masking voltage 139 is low to prevent the example switch controller 142 from transitioning switches while the example inductor 104 charges to prevent glitches due to sharp voltage transitions.

During the example second duration 610, the example switch SW1 110 is disabled and the example switch SW2 112 is enabled. At the beginning of the example second duration 610, the example masking voltage 139 drops to a low voltage to mask the example clock voltage 128 for a short duration of time (e.g., since the resonant voltage 116 may be non-sinusoidal during switch transitions). Enabling the switch SW2 increases the example resonant voltage 116. At the end of the example second duration 610, the example resonant current 606 is reaching zero and the example resonant voltage 116 is reaching a peak.

The third example duration 612 occurs when the example switch SW2 212 is disabled and the example switch SW3 114 is enabled. At the beginning of the third example duration 612, the example resonant voltage 116 reaches its peak, the example clock voltage 128 drops to a low voltage, and the example resonant current 606 becomes negative. Additionally, the example masking voltage 139 drops to a low voltage to mask the example clock voltage 128 for a short duration of time (e.g., since the resonant voltage 116 is non-sinusoidal during switch transitions). At the end of the example duration 612, the example resonant voltage 116 is reaching a peak and the example resonant current 606 is reaching zero.

Figure 7:
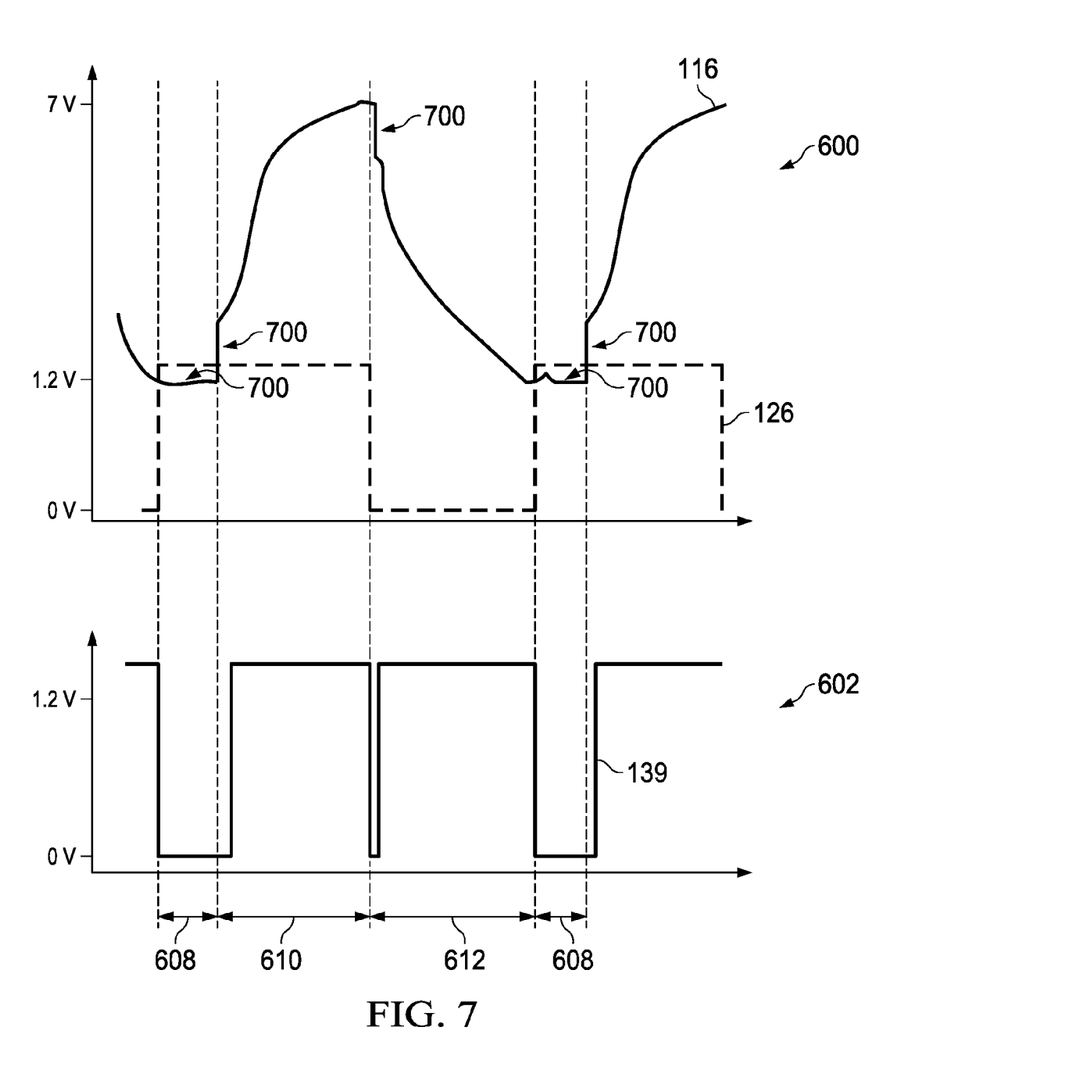
FIG. 7 an example timing diagram for one cycle of the example resonant voltage, the example clock voltage, and the example masking voltage of FIG. 6.

FIG. 7 illustrates one cycle of the example timing diagrams 600, 602 of FIG. 6. The illustrated example timing diagrams 600, 602 of FIG. 6 include the example resonant output voltage 116, the example clock voltage 128, the example masking voltage 139, the example durations 608, 610, 612, and example non-sinusoidal parts 700 of the example resonant voltage 116.

The example non-sinusoidal parts 700 represent either a transition between the example switches 110, 112, 114 and/or a time period associated with the example switch SW1 being enabled. As previously described, the output of the example comparator 126 (e.g., the example clock voltage 128) is masked (e.g., ignored) during non-sinusoidal parts 700 of the example resonant voltage 116. As displayed in the example second timing diagram 602, the example masking voltage 139 is dropped to a low voltage during such non-sinusoidal parts 700 of the example resonant voltage 116.

Figure 8:
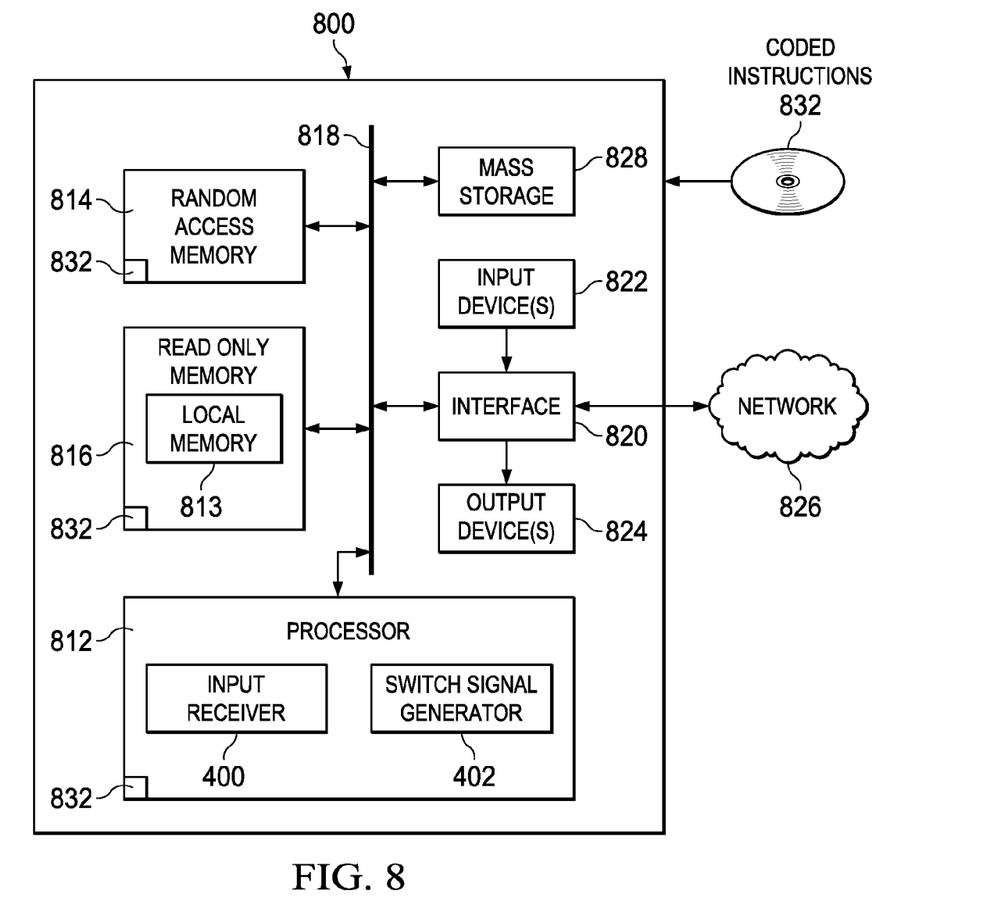
FIG. 8 is a block diagram of a processor platform structured to execute the example machine readable instructions of FIG. 5 to control the example switch controller 142 of FIGS. 1, 2, and 4.

FIG. 8 is a block diagram of an example processor platform 800 capable of executing the instructions of FIG. 8 to implement the example switch controller 142 of FIGS. 1-3. The processor platform 800 can be, for example, a server, a personal computer, a mobile device (e.g., a cell phone, a smart phone, a tablet such as an iPad™), a personal digital assistant (PDA), an Internet appliance, or any other type of computing device.

The processor platform 800 of the illustrated example includes a processor 812. The processor 812 of the illustrated example is hardware. For example, the processor 812 can be implemented by integrated circuits, logic circuits, microprocessors or controllers from any desired family or manufacturer.

The processor 812 of the illustrated example includes a local memory 813 (e.g., a cache). The example processor 812 of FIG. 8 executes the instructions of FIG. 5 to implement the example input receiver 400 and the example switch signal generator 402 of FIG. 4 to implement the example switch controller 142. The processor 812 of the illustrated example is in communication with a main memory including a volatile memory 814 and a non-volatile memory 816 via a bus 818. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is controlled by a clock controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 820 of the illustrated example, thus, typically includes a graphics driver card, a graphics driver chip or a graphics driver processor.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.).

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID systems, and digital versatile disk (DVD) drives.

The coded instructions 832 of FIG. 5 may be stored in the mass storage device 828, in the volatile memory 814, in the non-volatile memory 816, and/or on a removable tangible computer readable storage medium such as a CD or DVD.

From the foregoing, it would be appreciated that the above disclosed method, apparatus, and articles of manufacture determine a zero inductor current to control switches associated with a power converter when the inductor current is zero. Controlling switches while the inductor current is low reduces energy loss. Using the examples disclosed herein, the zero inductor current may be determined in real time without any settling time and/or induced delay with minimal power dissipation. Additionally, since the input signal is applied to an AC coupling capacitor, there is no need for additional circuit implementation to account for biasing requirements. Further, examples disclosed herein can input high voltage signals due to the AC coupling capacitor. Examples disclosed herein require minimum additional circuiting to determine the zero inductor current. Such minimum circuitry reduces the cost and complexity of power converters.

Conventional techniques require additional complex circuitry and cannot handle real time signals. Conventional techniques include increased power consumption, a more complex circuit, and less efficient zero current detection. By using example disclosed herein, real-time zero inductor current is determined within minimum additional circuitry minimizing power consumption and maximize switch transition speed.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:

1. An apparatus comprising:
    a resonance circuit to output a first voltage and a first current;
    a high pass filter to receive the first voltage and output a second voltage into an input of a comparator;
    the comparator to:
        when the second voltage is above a third voltage, output a first output voltage; and
        when the second voltage is below the third voltage, output a second output voltage; and
    a switch controller to:
        determine when the first current is zero based the output of the comparator; and enable a set of switches based on when the first current is zero;
wherein the resonance circuit includes the set of switches, the set of switches controlling the first voltage;
wherein only one switch of the set of switches is enabled at a time;
wherein the set of switches includes:
a first switch, wherein enabling the first switch charges an inductor associated with the resonance circuit;
a second switch, wherein enabling the second switch increases the first voltage; and
a third switch, wherein enabling the third switch decreases the first voltage.

2. The apparatus of claim 1, wherein the switch controller is structured to:
in response to receiving the first output voltage, enable the first switch;
in response to the duration of time ending, disable the first switch and enable the second switch; and
in response to receiving the second output voltage, disable the second switch and enable the third switch.

3. The apparatus of claim 2, wherein the first switch is enabled for a duration of time after receiving an enable signal.

4. The apparatus of claim 2, wherein the first switch is enabled when the first current is zero.

5. The apparatus of claim 2, further including a masking circuit to prevent the switch controller from switch transitioning a) when the first switch is enabled or b) for a second duration of time after an enabling transition of the set of switches.

6. The apparatus of claim 5, wherein the preventing of the switch controller from switch transitioning prevents a glitch caused by a sharp transition of the first voltage.

7. The apparatus of claim 5, wherein the first current is zero when the first voltage is at a maximum or a minimum.

8. A method comprising:
outputting a first voltage and a first current;
receiving the first voltage and output a second voltage into an input of a comparator;
when the second voltage is above a third voltage, outputting a first output voltage;
when the second voltage is below the third voltage, outputting a second output voltage;
determining when the first current is zero based the output of the comparator; and
enabling a set of switches based on when the first current is zero;
wherein enabling the set of switches includes enabling only one switch of the set of switches at a time;
wherein the set of switches includes:
a first switch, wherein enabling the first switch charges an inductor associated with the resonance circuit;
a second switch, wherein enabling the second switch increases the first voltage; and
a third switch, wherein enabling the third switch decreases the first voltage.

9. The method of claim 8, further including:
in response to receiving the first output voltage, enabling the first switch;
in response to the duration of time ending, disabling the first switch and enable the second switch; and
in response to receiving the second output voltage, disabling the second switch and enable the third switch.

10. The method of claim 9, wherein the first switch is enabled for a duration of time after receiving an enable signal.

11. The method of claim 9, wherein the first switch is enabled when the first current is zero.

12. The method of claim 9, further including preventing switch transitioning a) when the first switch is enabled or b) for a second duration of time after an enabling transition of the set of switches.

13. The method of claim 12, wherein the preventing of the switch transitioning prevents a glitch caused by a sharp transition of the first voltage.

14. The method of claim 12, wherein the first current is zero when the first voltage is at a maximum or a minimum.

15. A computer readable medium comprising instructions that, when executed, cause a machine to at least:
output a first voltage and a first current;
receive the first voltage and output a second voltage into an input of a comparator;
when the second voltage is above a third voltage, output a first output voltage;
when the second voltage is below the third voltage, output a second output voltage;
determine when the first current is zero based the output of the comparator; and
enable a set of switches based on when the first current is zero;
wherein enabling the set of switches includes enabling only one switch of the set of switches at a time;
wherein the set of switches includes a first switch, a second switch, and a third switch, wherein the instructions cause the machine to:
charge an inductor associated with the resonance circuit by enabling the first switch;
increase the first voltage by enabling the second switch; and
decrease the first voltage by enabling the third switch.

16. The computer readable medium of claim 15, wherein the instructions cause the machine to:
in response to receiving the first output voltage, enable the first switch;
in response to the duration of time ending, disable the first switch and enable the second switch; and
in response to receiving the second output voltage, disable the second switch and enable the third switch.

17. The computer readable medium of claim 16, wherein the instructions cause a machine to enable the first switch for a duration of time after receiving an enable signal.

18. The computer readable medium of claim 16, wherein the instructions cause a machine to enable the first switch when the first current is zero.

19. The computer readable medium of claim 16, wherein the instructions cause the machine to prevent switch transitioning a) when the first switch is enabled or b) for a second duration of time after an enabling transition of the set of switches.

20. The computer readable medium of claim 19, wherein the preventing of the switch transitioning prevents a glitch caused by a sharp transition of the first voltage.

21. The computer readable medium of claim 19, wherein the first current is zero when the first voltage is at a maximum or a minimum.

* * * * *